(12) United States Patent
Snyder

(10) Patent No.: US 7,052,945 B2
(45) Date of Patent: May 30, 2006

(54) SHORT-CHANNEL SCHOTTKY-BARRIER MOSFET DEVICE AND MANUFACTURING METHOD

(75) Inventor: John P. Snyder, Edina, MN (US)

(73) Assignee: Spinnaker Semiconductor, Inc., Eden Prairie, MN (US)

( * ) Notice: Subject to any disclaimer, the term of this patent is extended or adjusted under 35 U.S.C. 154(b) by 0 days.

(21) Appl. No.: 10/360,194

(22) Filed: Feb. 7, 2003

(65) Prior Publication Data

US 2003/0139002 A1    Jul. 24, 2003

Related U.S. Application Data

(60) Continuation of application No. 10/236,685, filed on Sep. 6, 2002, now Pat. No. 6,744,103, which is a continuation of application No. 09/777,536, filed on Feb. 6, 2001, now Pat. No. 6,495,882, which is a division of application No. 09/465,357, filed on Dec. 16, 1999, now Pat. No. 6,303,479.

(51) Int. Cl.
*H01L 21/00*    (2006.01)

(52) U.S. Cl. .................. 438/197; 438/581; 438/199

(58) Field of Classification Search ................ 438/217, 438/580–583, 510, 197, 199, 200; 257/288, 257/369, 327, 345
See application file for complete search history.

(56) References Cited

U.S. PATENT DOCUMENTS

| 4,053,924 A | 10/1977 | Roman et al. |
| 4,300,152 A | 11/1981 | Lepselter |
| 4,485,550 A | 12/1984 | Koeneke et al. |
| 4,513,309 A | 4/1985 | Cricchi |
| 4,554,569 A | 11/1985 | Tove et al. |
| RE32,613 E | 2/1988 | Lepselter et al. |
| 4,780,429 A | 10/1988 | Roche et al. |
| 4,942,441 A | 7/1990 | Konishi et al. |
| 5,040,034 A | 8/1991 | Murakami et al. |
| 5,079,182 A | 1/1992 | Ilderem et al. |
| 5,250,834 A | 10/1993 | Nowak |
| 5,323,053 A | 6/1994 | Luryi et al. |
| 5,338,698 A | 8/1994 | Subbanna |
| 5,361,225 A | 11/1994 | Ozawa |
| 5,444,302 A | 8/1995 | Nakajima et al. |
| 5,663,584 A | 9/1997 | Welch |
| 5,665,993 A | 9/1997 | Keller et al. |

(Continued)

FOREIGN PATENT DOCUMENTS

EP    0 603 102 A2    6/1994

(Continued)

OTHER PUBLICATIONS

Tucker, J.R. *Schottky Barrier MOSFETs for Silicon Nanoelectronics*. Jan. 1997, IEEE Frontiers in Electronics, pp. 97-100.

(Continued)

*Primary Examiner*—Laura M. Schillinger
(74) *Attorney, Agent, or Firm*—Dorsey & Whitney LLP

(57) ABSTRACT

A MOSFET device and method of fabricating are disclosed. The present invention utilizes Schottky barrier contacts for source and/or drain contact fabrication within the context of a MOSFET device structure to eliminate the requirement for halo/pocket implants and shallow source/drain extensions to control short channel effects. Additionally, the present invention unconditionally eliminates the parasitic bipolar gain associated with MOSFET fabrication, reduces manufacturing costs, tightens control of device performance parameters, and provides for superior device characteristics as compared to the prior art.

38 Claims, 11 Drawing Sheets

U.S. PATENT DOCUMENTS

| | | | |
|---|---|---|---|
| 5,760,449 | A | 6/1998 | Welch |
| 5,767,557 | A | 6/1998 | Kizilyalli |
| 5,801,398 | A | 9/1998 | Hebiguchi |
| 5,883,010 | A | 3/1999 | Merrill et al. |
| 6,037,605 | A | 3/2000 | Yoshimura |
| 6,160,282 | A | 12/2000 | Merrill |
| 6,268,636 | B1 | 7/2001 | Welch |
| 6,303,479 | B1* | 10/2001 | Snyder ............ 438/581 |
| 6,323,528 | B1 | 11/2001 | Yamazaki et al. |
| 6,353,251 | B1 | 3/2002 | Kimura |
| 6,452,232 | B1* | 9/2002 | Adan ............ 257/347 |
| 6,495,882 | B1* | 12/2002 | Snyder ............ 257/327 |
| 6,509,609 | B1 | 1/2003 | Zhang et al. |
| 6,661,061 | B1* | 12/2003 | Gardner et al. ............ 257/369 |
| 6,744,103 | B1* | 6/2004 | Snyder ............ 257/369 |
| 6,784,035 | B1* | 8/2004 | Snyder et al. ............ 438/167 |
| 6,949,787 | B1* | 9/2005 | Snyder et al. ............ 257/310 |
| 6,974,737 | B1* | 12/2005 | Snyder et al. ............ 438/199 |
| 2002/0030231 | A1 | 3/2002 | Okawa et al. |
| 2003/0008444 | A1* | 1/2003 | Snyder ............ 438/197 |
| 2003/0032270 | A1* | 2/2003 | Snyder et al. ............ 438/571 |
| 2003/0034532 | A1* | 2/2003 | Snyder et al. ............ 257/410 |
| 2003/0139001 | A1* | 7/2003 | Snyder et al. ............ 438/197 |
| 2003/0139002 | A1* | 7/2003 | Snyder ............ 438/197 |
| 2003/0235936 | A1* | 12/2003 | Snyder et al. ............ 438/92 |
| 2004/0041226 | A1* | 3/2004 | Snyder et al. ............ 257/471 |
| 2004/0171240 | A1* | 9/2004 | Snyder et al. ............ 438/571 |
| 2005/0003595 | A1* | 1/2005 | Snyder et al. ............ 438/167 |
| 2005/0106821 | A1* | 5/2005 | Snyder et al. ............ 438/288 |
| 2005/0118793 | A1* | 6/2005 | Snyder et al. ............ 438/581 |
| 2005/0139860 | A1* | 6/2005 | Snyder et al. ............ 257/155 |
| 2005/0287730 | A1* | 12/2005 | Snyder et al. ............ 438/200 |

FOREIGN PATENT DOCUMENTS

| | | |
|---|---|---|
| JP | 06097109 | 4/1994 |
| JP | 2000124329 | 4/2000 |
| WO | WO 01/45157 A1 | 6/2001 |

OTHER PUBLICATIONS

LaPlante, Philip A. (Editor-in-Chief). *Comprehensive Dictionary of Electrical Engineering.* 1999, IEEE Press, p. 97.

Muller, Richard S. and Kamins, Theodore I. *Device Electronics for Integrated Circuit.* 1977, 1986, John Wiley & Sons, Second Edition, pp. 448, 505-511.

Sze, S.M. *Physics of Semiconductor Devices.* 1981, John Wiley & Sons, Second Edition, pp. 451-453.

Pierret, Modular Series on Solid State Devices, vol. 1 Semiconductor Fundamentals, 1983, Addison-Wesley, pp. 29-33.

Huang et al. *Two Dimensional Numerical Simulation of Schottky Barrier MOSFET with Channel Length to 10 nm.* IEEE Transactions on Electron Devices, vol. 45, No. 4, Apr. 1988, pp. 842-848.

Saitoh et al. *Analysis of Short-Channel Schottky Source/Drain MOSFET on Silicon-on-Insulator Substrate Demonstration of Sub-50-nm n-Type Devices with Metal Gate.* Jpn. J. Appl. Phys., part 1, vol. 38, No. 11, Nov. 1999, pp. 6226-6231.

Wolf, Stanley. *Silicon Processing For the VLSI Era, vol. 3: The Submicron MOSFET,* Lattice Press, Sunset Beach, CA, pp. 523-528 (1995).

Lepselter, M.P., Sze, S.M. *SB-IGFET: An Insulated Gate Field Effect Transistor Using Schottky Barrier Contacts for Source and Drain.* Proceedings of the IEEE, Aug. 1968; pp. 1400-1402.

Lepselter, M.P., MacRae, A.U., MacDonald, R.W. *SB-IGFET, II: An Ion Implanted IGFET Using Schottky Barriers.* Proceedings of the IEEE, May 1969; pp. 812-813.

Kisaki, Hitoshi. *Tunnel Transistor.* Proceedings of the IEEE, Jul. 1973; pp. 1053-1054.

Tu, K.N., Thompson, R.D., Tsaur, B.Y. *Low Schottky Barrier of Rare-Earth Silicide on n-Si.* Applied Physics Letters, vol. 38, No. 8, Apr. 1981; pp. 626-628.

Koeneke, C.J., Sze, S.M., Levin, R.M., Kinsbron, E. *Schottky MOSFET for VLSI.* IEDM, 1981; pp. 367-370.

Sugino, M., Akers, L.A., Rebeschini, M.E. *CMOS Latch-Up Elimination Using Schottky Barrier PMOS.* IEDM, 1982; pp. 462-465.

Koeneke, C.J., Lynch, W.T. *Lightly Doped Schottky MOSFET.* IEDM, 1982; pp. 466-469.

Mochizuki, T., Wise, K.D. *An n-Channel MOSFET with Schottky Source and Drain.* IEEE Electron Device Letters, EDL-5, No. 4, Apr. 1984; pp. 108-111.

Oh, C.S., Koh, Y.H., Kim, C.K. *A New P-Channel MOSFET Structure with Schottky Clamped Source and Drain,* IEDM, 1984; pp. 609-612.

Swirhun, Stanley E., et al. *A VLSI Suitable Schottky Barrier CMOS Process.* IEEE Transactions on Electron Devices, ED-32, No. 2, Feb. 1985; pp. 194-202.

Tove, P.A., Bohlin, K., Masszi, F., Norde, H., Nylander, J., Tiren, T., Magnusson, U. *Complementary Si MESFET Concept Using Silicon-on-Sapphire Technology.* IEEE Electron Device Letters, vol. 9, No. 1, Jan. 1988; pp. 47-49.

Tove, P.A., Bohlin, K.E., Norde, H., Magnusson, U., Tiren, J., Soderbarg, A., Rosling, M., Masszi, F., Nyander, J. *Silicon IC Technology Using Complementory MESFETs.* Solid State Devices, Elsevier Science Publishers (North Holland), 1988; pp. 607-609.

Tsui, B., Chen, M. *A Novel Process for High-Performance Schottky Barrier PMOS.* J. Electrochem Soc., vol. 136, No. 5, May 1989; pp. 1456-1459.

Misra, D., Simhadri, V.S. *A Survey of the Potential of an IrSi Schottky Barrier MOSFET Based on Simulation Studies.* Solid State Electronics, vol. 35, No. 6, 1992; pp. 829-833.

Hattori, Reiji, Nakae, Akihiro, Shirafuji, Junji. *A New Type of Tunnel-Effect Transistor Employing Internal Field Emission of Schottky Barrier Junction.* Japan J. Appl. Phys., vol. 31, 1992; pp. L1467-L1469.

Unewisse, M.H., Storey, J.W.V. *Electrical and Infared Investigation of Erbium Silicide.* J. Appl. Phys., vol. 72, No. 6, Sep. 1992; pp. 2367-2371.

Hattori, Reiji, Shirafuji, Junji. *Numerical Simulation of Tunnel Effect Transistors.* Japan J. Appl. Phys., vol. 33, 1994; pp. 612-618.

Tucker, J.R., Wang, C., Lyding, J.W., Shen, T.C., Abeln, G.C. *Nanometer Scale MOSFETs and STM Patterning on Si.* SSDM 1994, Aug. 1994; pp. 322-324.

Tucker, J.R., Wang, C., Carney, P.S. *Silicon Field-Effect Transistor Based on Quantum Tunneling.* Applied Physics Letters, vol. 65, No. 5, Aug. 1, 1994; pp. 618-620.

Kimura, Mitsuteru, Matsudate, Tadashi. *A New Type of Schottky Tunnel Transistor.* IEEE Electron Device Letters, EDL-15, No. 10, Oct. 1994, pp. 412-414.

Snyder, John P., Helms, C.R., Nishi, Yoshio. *Experimental Investigation of a PtSi Source and Drain Field Emission Transistor.* Applied Physics Letters, vol. 67, No. 10, Sep. 4, 1995; pp. 1420-1422.

Rishton, S.A., Ismail, K., Chu, J.O., Chan, K. *A MOS Transistor with Schottky Source/Drain Contacts and a Self-Aligned Low-Resistance T-gate*. Microelectronics Engineering, vol. 35, 1997; pp. 361-363.

Nishisaka, Mika, Asano, Tanemasa. *Reduction of the Floating Body Effect in SOI MOSFETs by Using Schottky Source/Drain Contacts*. Japan J. Appl. Phys., vol. 37, Mar. 1998; pp. 1295-1299.

Wang, C., Snyder, John P., Tucker, J.R. *Sub-50nm PtSi Schottky Source/Drain p-MOSFETs*. 56th Annual Device Research Conference Digest, Jun. 1998, pp. 72-73.

Taur, Yuan, Wann, Clement H., Frank, David J. *25 nm CMOS Design Considerations*. IEDM Technical Digest, Dec. 1998; pp. 789-792.

Hargrove, M., Crowder, S., Novak, E., Logan, R., Han, L.K., Ng, H., Ray, A., Sinitsky, D., Smeys, P., Guarin, F., Oberschmidt, J., Crabbe, E., Yee, D., Su, L. *High Performance Sub-0.08um CMOS with Dual Gate Oxide and 9.7 ps Inverter Delay*. IEDM Technical Digest, Dec. 1998; pp. 627-630.

Zhao, Q.T., Klinkhammer, F., Dolle, M., Kappius, L., Mantl, S. *Nanometer Patterning of Epitaxial CoSi2/Si(100) for Ultrashort Channel Schottky Barrier Metal-Oxide-Semiconductor Field Effect Transistors*. Applied Physics Letters, vol. 74, No. 3, Jan. 18, 1999; pp. 454-456.

Wang, C., Snyder, John P., Tucker, J.R. *Sub-40nm PtSi Schottky Source-Drain Metal-Oxide-Semiconductor Field-Effect-Transistors*. Applied Physics Letters, vol. 74, No. 8, Feb. 22, 1999; pp. 1174-1176.

Snyder, John P., Helms, C.R., Nishi, Yoshio. *Analysis of the Potential Distribution in the Channel Region of a Platinum Silicided Source/Drain Metal Oxide Semiconductor Field Effect Transistor*. Applied Physics Letters, vol. 74, No. 22, May 31, 1999; pp. 3407-3409.

Saitoh, W., Yamagami, S., Itoh, A., Asada, M. *35nm Metal Gate SOI-p-MOSFETs with PtSi Schottky Source/Drain*. 57th Annual Device Research Conference Digest, Jun. 1999; pp. 30-31.

Geppert, Linda. *The 100-Million Transistor IC*. IEEE Spectrum, Jul. 1999; pp. 23-24.

Taur, Yuan. *The Incredible Shrinking Transistor*. IEEE Spectrum, Jul. 1999; pp. 25-29.

Neudeck, Gerold W. *Volume II: The PN Junction Diode, Modular Series On Solid State Devices*. Addison-Wesley, 1983; pp. 8-10.

On-line Encyclopedia Britannica, 2001, definition of "rare-earth element.", date not established; 2 pages.

Sze, S.M. *Physics of Semiconductor Devices*, John Wiley & Sons, Second Edition, 1981; pp. 293-294.

Calvet, L. E., Luebben, H., Reed, M.A., Wang, C., Snyder, J.P., and Tucker, J.R. *Subthreshold and scaling of PtSi Schottky barrier MOSFETs*, 2000 Academic Press, Superlattices and Microstructures, vol. 28, No. 5/6; pp. 501-506.

Wolf, Stanley. *Silicon Processing for the VLSI Era, vol. 3: The Submicron MOSFET*. Lattice Press, 1995; pp. 183-187.

Web page "provided by Laurie Calvet", "Device Physics of the SBMOSFET", http://www.eng.yale.edu/reedlab/research/semicond.html, date not established; 7 pages.

Winstead, B. and Ravaioli, U. *Simulation of Schottky Barrier MOSFET's with a Coupled Quantum Injection/Monte Carlo Technique*. IEEE Transactions on Electron Device, vol. 47, No. 6, Jun. 2000; pp. 1241-1246.

Gang, D., Xiaoyan, L., Lei, S., Jiaping, Y., Ruqi, H., Houlet, P., and Fujitan, H. *Monte Carlo Simulation of 50nm n-Channel Schottky Barrier Tunneling Transistors*. Chinese Journal of Electronics, vol. 11, No. 2, Apr. 2002; pp. 200-203.

Rishton, S.A., Ismail, K., Chu, J.O., Chan, K.K., Lee, K.Y. *New Complimentary metal-oxide semiconductor technology with self-aligned Schottky source/drain and low-resistance T gates*. J. Vac. Sci. Technol. B, 15(6), Nov./Dec. 1997, pp. 2795-2798.

Kedzierski, J., Xuan, P., Subramanian, V., Bokor, J., King, T-J., Hu, C., Anderson, E. *A 20 nm gate-length ultra-thin body p-MOSFET with silicide source/drain*. Superlattices and Microstructures, vol. 28, No. 5/6, 2000, pp. 445-452.

Lancaster, D. *CMOS Cookbook, Second Edition*. Howard W. Sams and Company, 1988, p. 2.

Magnusson, U. et al. "Bulk Silicon Technology For Complementary MESFETs." *Electronics Letters*, vol. 25, No. 9, Apr. 27. 1989; pp. 565-566.

\* cited by examiner

*PRIOR ART*

*PRIOR ART*

SHORT-CHANNEL SCHOTTKY-BARRIER MOSFET DEVICE AND MANUFACTURING METHOD

CROSS-REFERENCE TO RELATED APPLICATION(S)

This application is a continuation of and claims priority from U.S. patent application Ser. No. 09/777,536, filed Feb. 6, 2001 now U.S. Pat. No. 6,495,882, which is a divisional of and claims priority from U.S. patent application Ser. No. 09/465,357, filed Dec. 16, 1999, now U.S. Pat. No. 6,303,479, issued on Oct. 16, 2001, both of which are incorporated by reference in their entirety.

BACKGROUND OF THE INVENTION

The present invention relates generally to the field of metal oxide semiconductor field effect transistors (MOSFETs), and has specific application to the fabrication of these devices in the context of an integrated circuit (IC).

Since the invention of the transistor in the late 1940s, tremendous advances have been made in the field of microelectronics. Current technology allows for the cost-effective fabrication of integrated circuits (ICs) with over 100 million components—all on a piece of silicon roughly 10 mm on a side. The one billion transistor IC will be commercially available within a few years. The desire for greater functionality and performance at less cost per IC drives several trends.

First, functionality drives IC transistor counts up. Second, the transistors themselves are being reduced in size so as to achieve greater packing density and, very importantly, to improve their performance. As far as performance is concerned, the key parameter for Metal-Oxide-Semiconductor-Field-Effect-Transistors (MOSFETs, the dominant transistor technology of the day) is the channel length. The channel length (L) is the distance that charge carriers must travel to pass through the device, and a reduction in this length simultaneously implies higher current drives, reduced parasitic resistances and capacitances and improved high-frequency performance. A common figure-of-merit is the power-delay product, and this generalized measure of transistor performance improves as the cube of the inverse of the channel length ($1/L^3$). This explains the tremendous incentive that IC manufacturers have to reduce the channel length as much as manufacturing capabilities will allow.

For digital applications, MOS transistors behave like switches. When "on," they drive relatively large amounts of current, and when turned "off" they are characterized by a certain amount of leakage current. As channel lengths are reduced, drive currents increase, which is beneficial for circuit performance as stated above. However, leakage currents increase as well. Leaky transistors contribute to quiescent power dissipation (the power dissipated by an IC when idle) and in extreme cases can affect the transfer of binary information during active operation. Device designers therefore have good reason to keep leakage currents low as channel lengths are reduced.

MOS transistor leakage currents are traditionally controlled by introducing controlled amounts of impurities (dopants) into the channel region of the device, and by tailoring the source/drain lateral and vertical doping distributions. Although these approaches are effective in shoring up the potential barrier internal to the MOS transistor and therefore reducing the leakage current, they can also contribute to degraded drive current and increased parasitic capacitance—the very items that channel length reduction is meant to improve. Furthermore, depending on exactly how in the manufacturing process the channel and tailored source/drain dopants are introduced, the manufacturing cost can be affected significantly. Given traditional MOS transistor design and architecture, there are only limited solutions to the trade-off between drive current, leakage current, parasitic capacitance and resistance, and manufacturing complexity/cost.

The present invention offers a new relationship between these competing requirements, and makes possible MOS devices with characteristics that are not achievable with traditional (impurity doped) MOS architectures. The use of metal for the source and drain and a simple, uniformly implanted channel dopant profile provides for improvements to device characteristics in terms of reduced parasitic capacitance, reduced statistical variations in these characteristics (especially as the channel length is decreased) and reduced manufacturing cost and complexity.

DESCRIPTION OF THE PRIOR ART

Doping Profiles

Previous generations of MOS transistors have relied on laterally uniform, and vertically non-uniform channel doping profiles to control drain-to-source leakage currents. See Yuan Taur, "The Incredible Shrinking Transistor", IEEE SPECTRUM, pages 25–29 (www.spectrum.ieee.org, ISSN 0018-9235, July 1999). FIG. 1 illustrates an exemplary long-channel conventional MOS device (100) that comprises an impurity doped source (101), an impurity doped drain (102), a conventional MOS type gate stack (103), and a laterally uniform channel doping profile (104) in the substrate to assist in the control of source-to-drain leakage currents. Devices are electrically isolated from each other via a field oxide (105). Such channel dopant profiles are common in devices with channel lengths down to approximately 200 nanometers (nm).

However, as device channel lengths have been reduced into the 100 nm regime the literature teaches that channel doping profiles that are non-uniform in both the lateral and vertical directions are required. Referencing FIG. 2, the exemplary short-channel MOS device (200) has some elements similar to the long-channel MOS device (100). The structure comprises a conventional impurity doped source (201) and drain (202) as well as a conventional MOS gate stack (203) (width <~100 nm, corresponding to the channel length L). The structure further comprises shallow, impurity doped extensions for the source (208) and drain (209) electrodes which are used in conjunction with drain (206) and source (207) pocket doping as well as conventional channel doping (204) to control source to drain leakage currents. Source and drain electrodes (201) and (202) and their respective extensions (208) and (209) (the combination of all four of which comprise the tailored source/drain doping profile) are all of the same doping polarity (either N-type or P-type) and are of the opposite polarity from the channel (204) and pocket doping elements (206) and (207). Again, a field oxide (205) electrically isolates devices from each other.

In his paper entitled "25 nm CMOS Design Considerations" (1998 IEDM Technical Digest, page 789), Yuan Taur states:

" . . . an optimized, vertically and laterally non-uniform doping profile, called the super-halo, is needed to control the short channel effect."

A similar statement has been made in the IEEE Spectrum magazine:

" . . . in the 100 to 130 nm lithography generation, an optimally tailored profile that is both vertically and laterally non-uniform (Super-Halo) is need to control [short channel effects]." See Linda Geppert, "The 100-Million Transistor IC", IEEE SPECTRUM, pages 23–24 (www.spectrum.ieee.org, ISSN 0018-9235, July 1999).

Furthermore, virtually all the prior art that discusses device design for channel lengths less than 200 nm states or implies that channel doping profiles that are highly non-uniform in both the lateral and vertical directions are required for adequate control of drain-to-source leakage currents. For example, Hargrove in his paper "High-Performance sub 0.08 um CMOS with Dual Gate Oxide and 9.7 ps Inverter Delay (1998 IEDM, page 627) states "In order to achieve optimal device performance . . . strong halos coupled with shallow junctions are required."

The prior art is virtually unanimous in its statement that laterally and vertically non-uniform doping profiles, in the form of laterally non-uniform channel dopants and shallow source/drain extensions, are required for adequate control of short channel effects.

Pocket/Halo Implants

Laterally non-uniform channel doping profiles are almost exclusively introduced after the gate electrode has been defined and is in place. With the gate serving as an implant mask, dopants of the same type as those already in the substrate are introduced into the channel regions adjacent to the gate electrode's edges via ion-implantation. As mentioned previously, these are often referred to as "pocket" or "halo" implants. See Yuan Taur, "The Incredible Shrinking Transistor", IEEE SPECTRUM, page 28 (www.spectrum.ieee.org, ISSN 0018-9235, July 1999).

While effective at reinforcing the electrostatic potential barrier between the source and drain (and therefore reducing leakage currents), Halo/Pocket implants along with shallow source/drain extensions (the tailored source/drain doping profiles mentioned previously) add complexity to the manufacturing process. At least two additional lithography steps, as well as the associated cleans, implants, metrology, etc. are required to implement these process steps. As lithography is one of the most (if not the most) expensive process modules in the production process, this is a significant increase in manufacturing cost. Halo and Pocket implants as well as shallow source/drain extensions can also add parasitic capacitance and a random statistical variation to device electrical characteristics.

Channel doping profiles for short channel Schottky MOS devices have received only very limited attention in the prior art. J. R. Tucker discusses simulations done on very short channel SBMOS devices and only mentions in passing that " . . . some doping of the semiconductor channel region will be required in order to suppress (leakage) currents . . . ". See J. R. Tucker, C. Wang, J. W. Lyding, T. C. Shen, G. C. Abeln, "Nanometer Scale MOSFETs and STM Patterning on Si," SSDM 1994, pages 322–324; J. R. Tucker, C. Wang, P. S. Carney, "Silicon Field-Effect Transistor Based on Quantum Tunneling," Applied Physics Letters, 1 Aug. 1994, Vol. 65, No. 5, pages 618–620. It is significant to note that Tucker does not discuss in what manner one might go about introducing channel doping to suppress source-to-drain leakage currents.

Q. T. Zhao is the next author to explicitly address the issue of channel doping to control leakage currents. His approach (uniform doping of the substrate to quite high levels ($10^{17}$/ $cm^3$)) is well known to be non-optimal for short channel devices. Although he is successful in reducing leakage currents, he does so at the expense of increased source/drain-to-substrate capacitance. See Q. T. Zhao, F. Klinkhammer, M. Dolle, L. Kappius, S. Mantl, "Nanometer patterning of epitaxial CoSi2/Si(100) for ultrashort channel Schottky barrier metal-oxide-semiconductor field effect transistors," APPLIED PHYSICS LETTERS, Vol. 74 No. 3, 18 Jan. 1999, page 454.

W. Saitoh reports on a device built on SOI substrates but does not discuss substrate doping in this context. See W. Saitoh, S. Yamagami, A. Itoh, M. Asada, "35 nm metal gate SOI-P-MOSFETs with PtSi Schottky source/drain," Device Research Conference, Jun. 28–30, 1999, Santa Barbara, Calif., Paper II.A.6, page 30.

C. Wang mentions the use of "a layer of fully-depleted dopants beneath the active region" and "preimplanting a thin subsurface layer of fully depleted dopants" to control leakage currents, but does not describe the lateral uniformity or lack thereof of the doping profile, or how one might go about producing the "layer". See C. Wang, John P. Snyder, J. R. Tucker, "Sub-40 nm PtSi Schottky source/drain metal-oxide-semiconductor field-effect-transistors," APPLIED PHYSICS LETTERS, Vol. 74 No. 8, 22 Feb. 1999, pages 1174; C. Wang, John P. Snyder, J. R. Tucker, "Sub-50 nm PtSi Schottky source/drain P-MOSFETs," Annual Device Research Conference Digest 1998, pages 72–73.

Summary

Given the literature on substrate doping profiles for conventional short channel MOS transistors and the scant work on channel doping profiles for short channel Schottky MOS devices, the proposed invention offers a novel and non-obvious MOSFET device and fabrication approach with many advantages over the current state-of-the-art.

OBJECTS OF THE INVENTION

Accordingly, the objects of the present invention are (among others) to circumvent the deficiencies in the prior art and affect one or more of the following objectives:

1. Provide a system and method to permit MOSFETs to be fabricated with short channel lengths with less cost, higher performance and better tolerances than current fabrication technologies.

2. Reduce parasitic bipolar operation in integrated MOSFETs, thus reducing the potential for latchup and other anomalous behavior.

3. Provide for MOSFET devices that have in some circumstances a higher degree of radiation hardness.

While these objectives should not be understood to limit the teachings of the present invention, in general these objectives are achieved by the disclosed invention that is discussed in the following sections.

BRIEF SUMMARY OF THE INVENTION

Overview

Referencing FIG. 3, an exemplary embodiment of the present invention (300) consists simply of a conventional MOS gate stack (303) (gate electrode on silicon dioxide on a silicon substrate), metal source (301) and/or drain (302) electrodes, and channel dopants (304) that vary significantly in the vertical direction but not in the lateral direction. A field oxide (305) electrically isolates devices from each other.

The Schottky (or Schottky-like) barriers (307, 308) that exist along the interface of the corresponding metal source/ drain (301, 302) and the silicon substrate (306) act as an inherent pocket or halo implant and does so without added parasitic capacitance. It also eliminates the need for shallow source/drain extensions as the metal source/drain is by its nature shallow and highly conductive. Significant reductions in manufacturing complexity are therefore achieved by simultaneous elimination of the halo/pocket implants and the source/drain extensions. These are also major advantages over conventionally-architected-channel MOS devices.

Due to the atomically abrupt nature of the Schottky barrier and the very consistent and repeatable magnitude of this barrier, two sources of statistical variation which are endemic to conventional MOS devices are virtually eliminated. The random statistical nature of dopant introduction via ion-implantation in conventional devices produces significant variations in the position and magnitude of implanted dopants. This is true for both the halo/pocket and source/drain dopants. The result is a certain amount of random variation in device parameters such as channel length (L), drive current, and leakage current. These variations make circuit design more difficult and contribute to manufacturing cost via yield loss due to ICs that do not meet performance specifications. The problem becomes more severe as channel lengths are reduced due to the smaller effective volume of silicon per device, and therefore less averaging to smooth away statistical variations.

Because the metal source/drain (which replaces the conventional impurity doped source/drain) has a natural, very consistent and atomically abrupt Schottky barrier (307, 308) with the silicon substrate (306) whose position and magnitude are independent of channel length, and because this barrier essentially plays the role of the halo/pocket implant (making these implants unnecessary), statistical variations due to random placement of atoms during the source/drain and halo/pocket implants are essentially eliminated. This fact remains true and even becomes more true as the channel length is reduced.

Another benefit of the metal source/drain MOS architecture is the unconditional elimination of the parasitic bipolar gain. The parasitic bipolar gain is a direct result of using opposite doping types for the source/drain and substrate regions, and can result in latch-up and other deleterious effects. When the source/drain electrodes are constructed of metal, this parasitic gain is eliminated. This makes the metal source/drain architecture ideal for (among other things) high-radiation environments.

General Advantages

The present invention typically provides the following benefits as compared to the prior art:

1. Reduction in manufacturing complexity. Pocket/Halo implants and shallow source/drain extensions are not needed.
2. Reduction in capacitance due to absence of pocket/halo implants.
3. Reduction in random/statistical variations of device electrical characteristics due to absence of pocket/halo implants and course/drain extensions, and the use of metal for the source and drain.
4. Unconditional elimination of the parasitic bipolar gain and associated latchup.
5. Increased radiation hardness as compared to conventional MOS structures.

The above list of advantages should not be interpreted as to limit the scope of the present invention. However, one skilled in the art will recognize a plethora of application opportunities for the present invention teachings given the above-mentioned list of general advantages that are potentially available.

BRIEF DESCRIPTION OF THE DRAWINGS

For a fuller understanding of the advantages provided by the invention, reference should be made to the following detailed description together with the accompanying drawings wherein.

DETAILED DESCRIPTION

Embodiments are Exemplary

Figure 1:
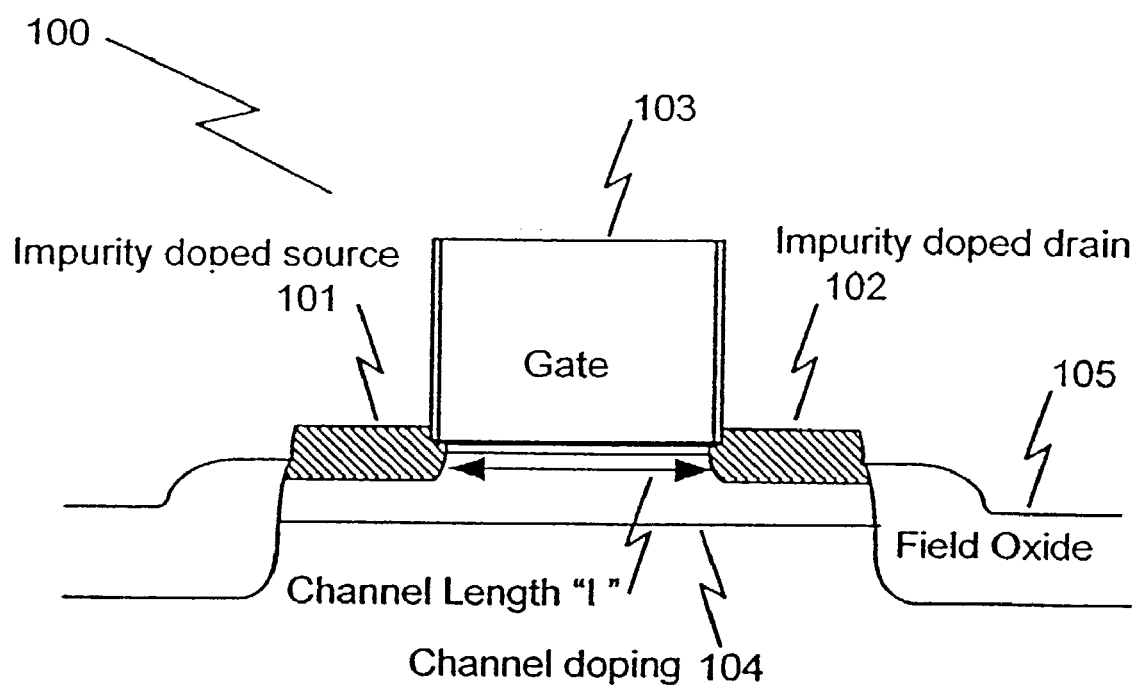
FIG. 1 illustrates a prior art long channel, impurity doped source/drain device.
Figure 2:
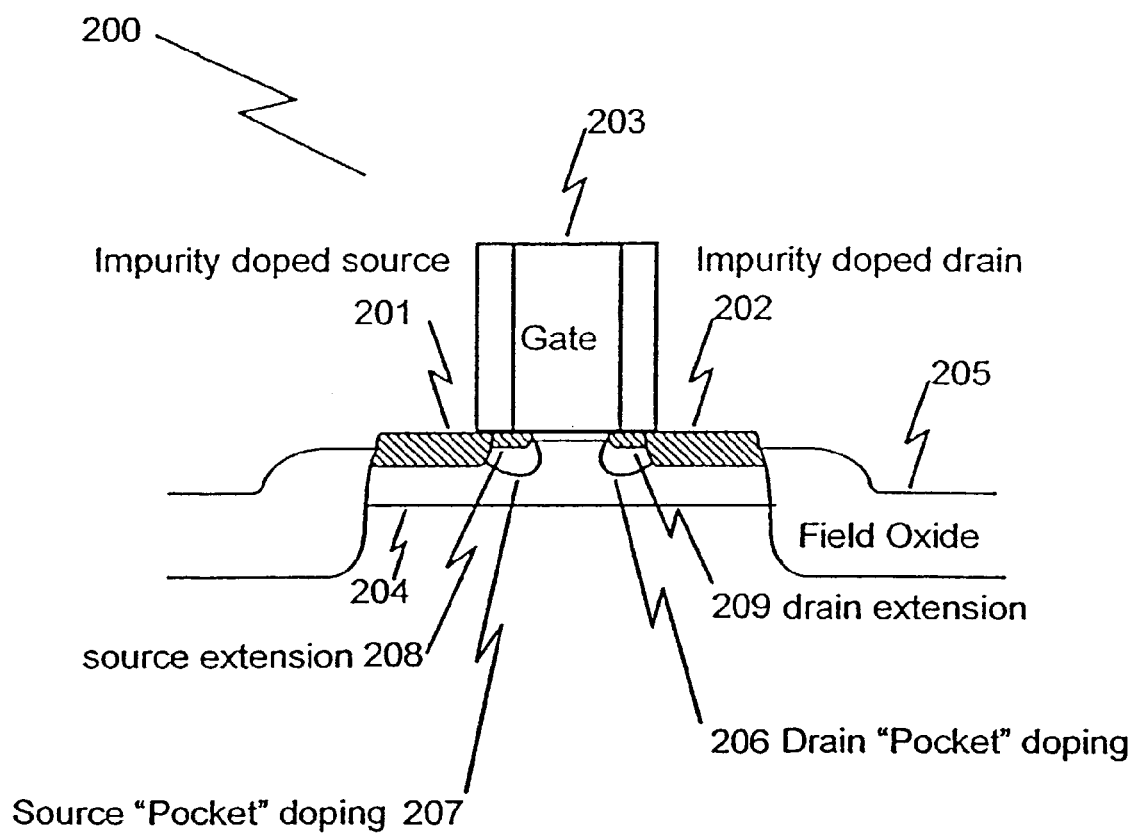
FIG. 2 illustrates a prior art short channel, impurity doped source/drain device with pocket implants and source/drain extensions.
Figure 3:
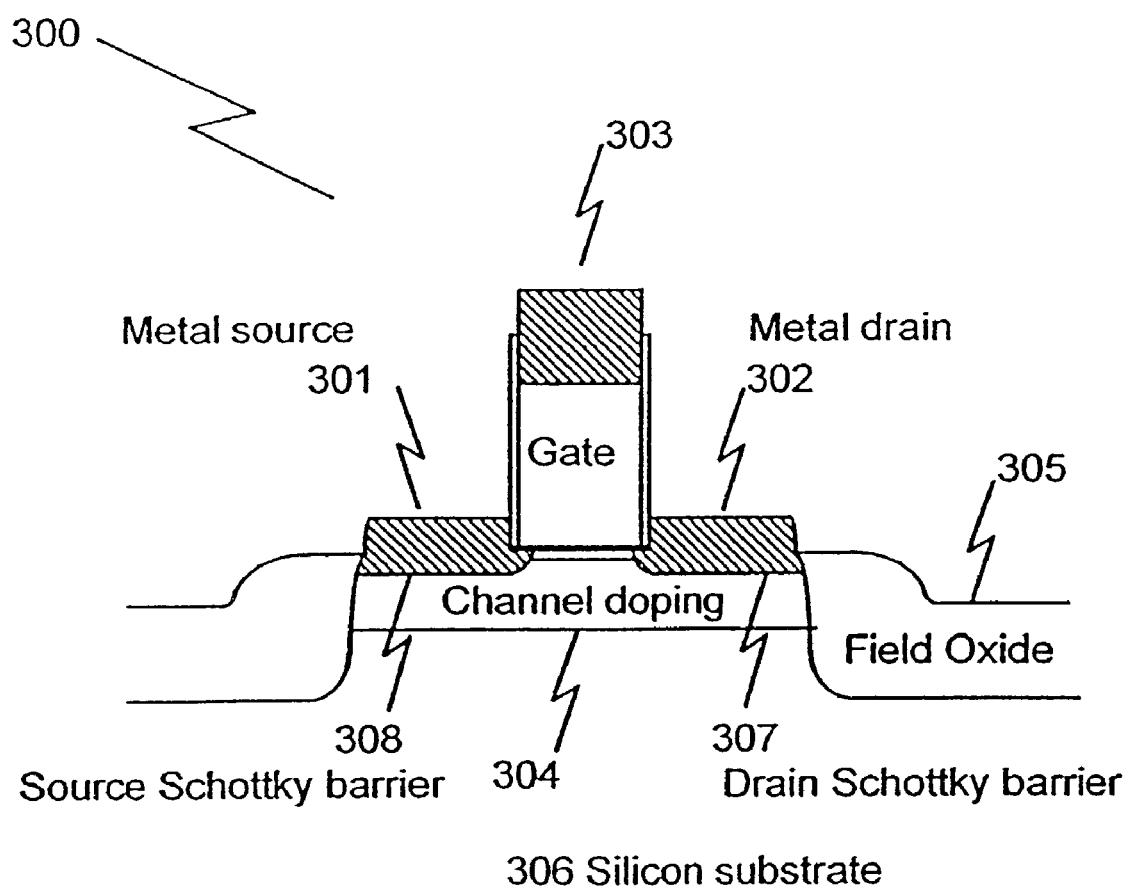
FIG. 3 illustrates an exemplary embodiment of the present invention as applied to a short channel, metal source/drain device without pocket implants.
Figure 4:
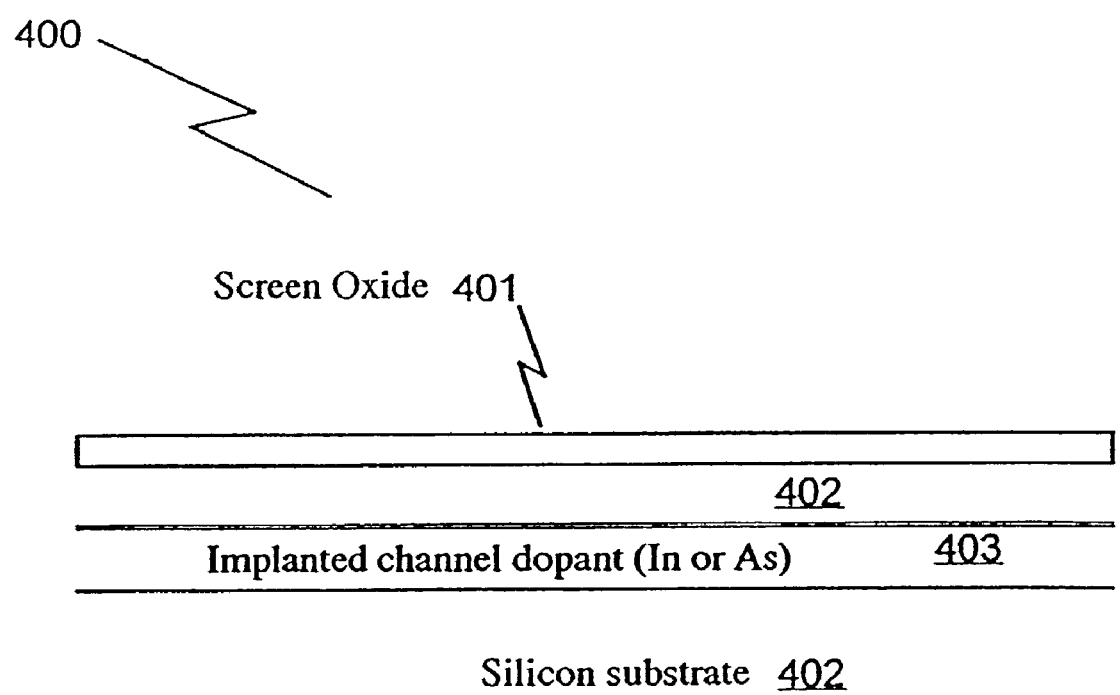
FIG. 4 illustrates an exemplary embodiment of the present invention process fabrication step using an implanted silicon substrate with approximately 200 A screen oxide.
Figure 5:
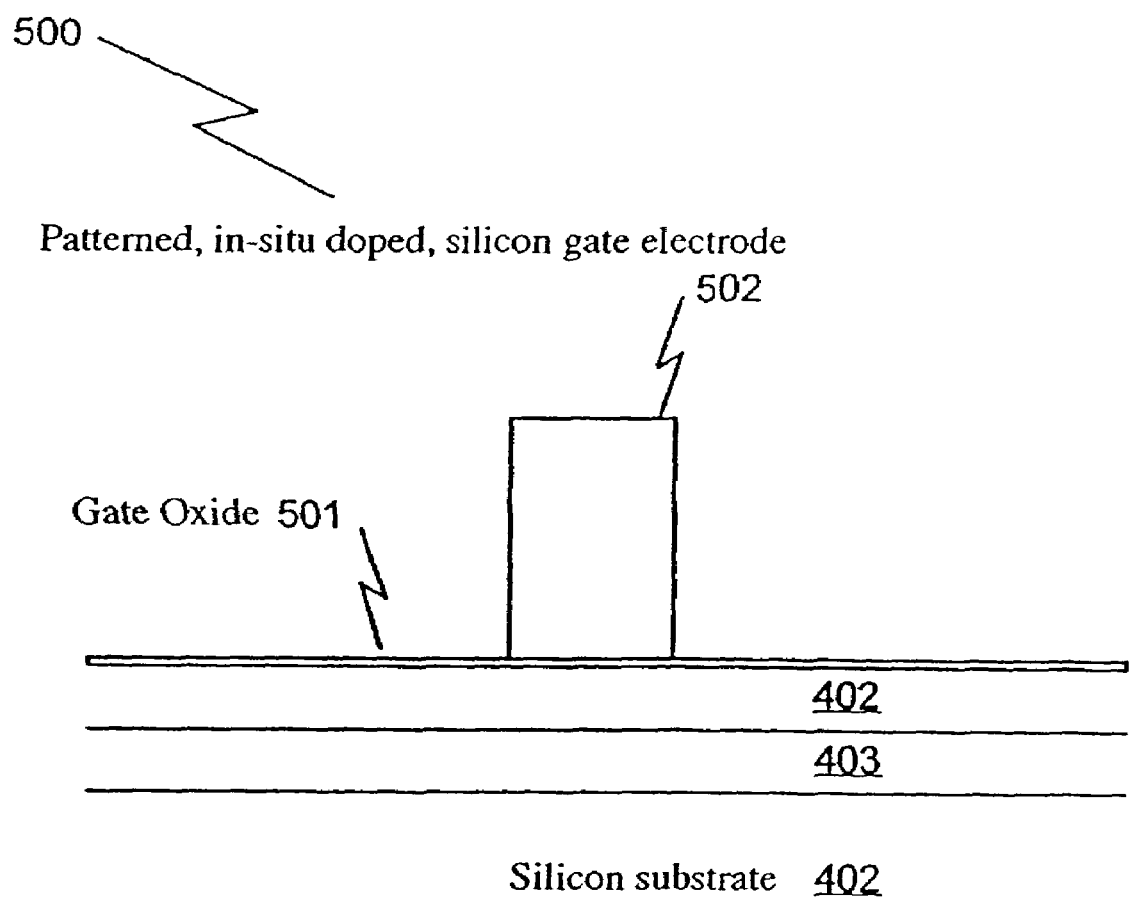
FIG. 5 illustrates an exemplary embodiment of the present invention process fabrication step using a patterned in-situ doped silicon film on thin gate oxide.
Figure 6:
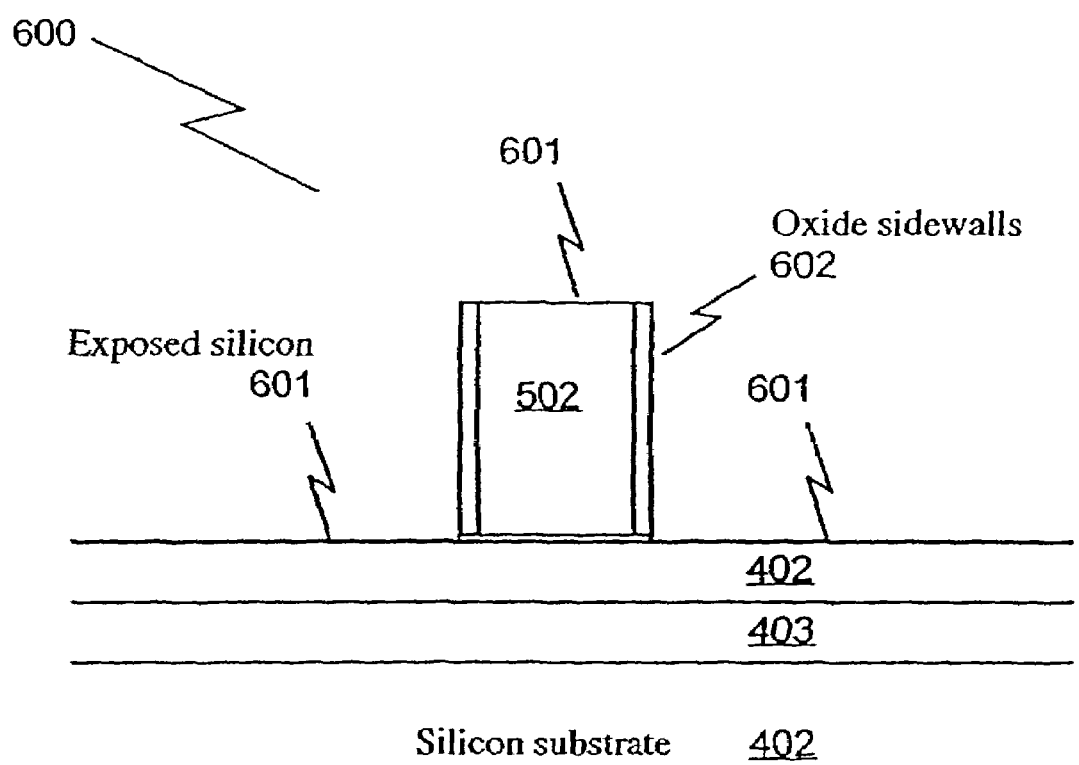
FIG. 6 illustrates an exemplary embodiment of the present invention process fabrication step using a formation of thin oxide sidewalls, and exposure of silicon in the gate, source and drain areas.
Figure 7:
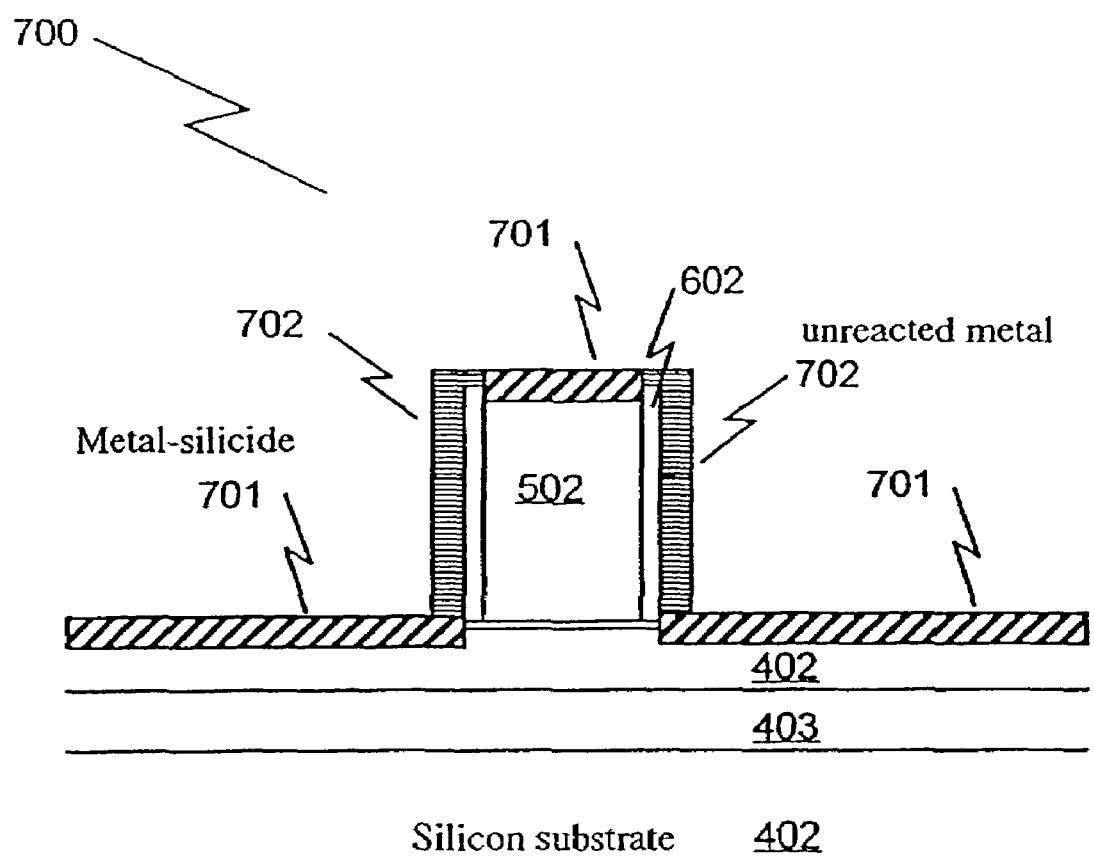
FIG. 7 illustrates an exemplary embodiment of the present invention process fabrication step using a metal deposition and solicidation anneal.
Figure 8:
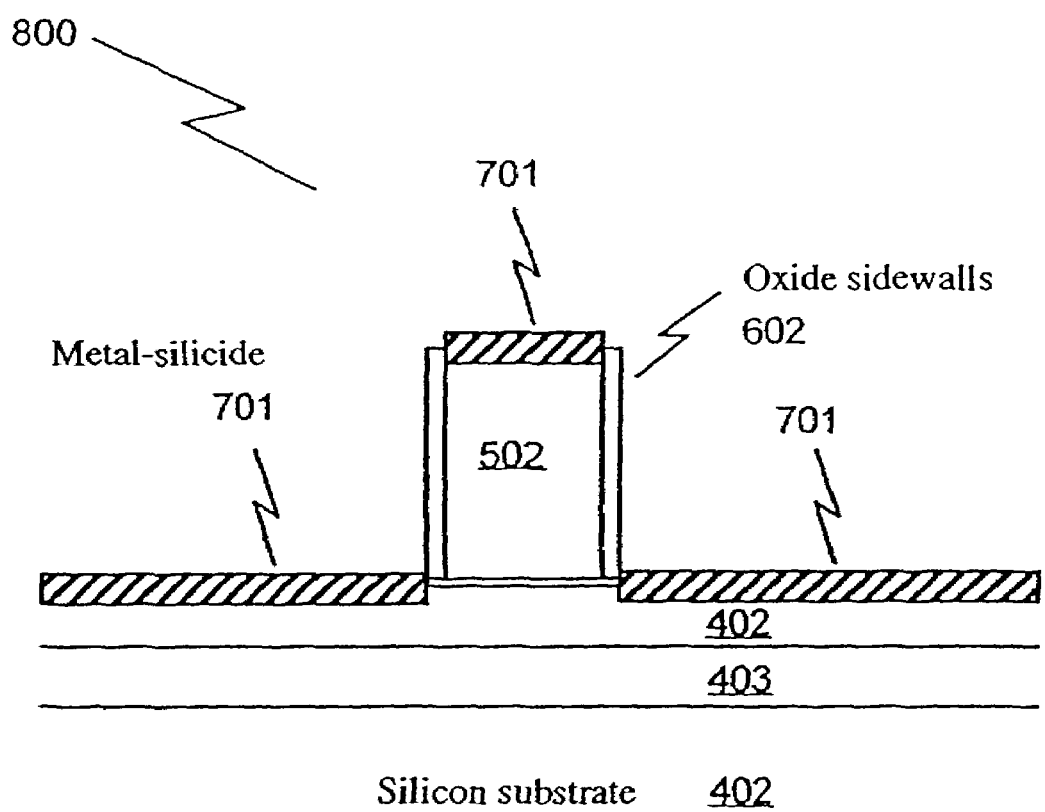
FIG. 8 illustrates an exemplary embodiment of the present invention process fabrication step using a removal of unreacted metal from the sidewalls.

While this invention is susceptible of embodiment in many different forms, there is shown in the drawings and will herein be described in detailed preferred embodiment of the invention with the understanding that the present disclosure is to be considered as an exemplification of the principles of the invention and is not intended to limit the broad aspect of the invention to the embodiment illustrated.

The numerous innovative teachings of the present application will be described with particular reference to the presently preferred embodiments, wherein these innovative teachings are advantageously applied to the particular problems of a MOSFET device. However, it should be understood that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and visa versa with no loss of generality.

Definitions

Throughout the discussion in this document the following definitions will be utilized:

System Blocks/Procedural Steps not Limitive

The present invention may be aptly described in terms of exemplary system block diagrams and procedural flowcharts. While these items are sufficient to instruct one of ordinary skill in the art the teachings of the present invention, they should not be strictly construed as limiting the scope of the present invention. One skilled in the art will be aware that system block diagrams may be combined and rearranged with no loss of generality, and procedural steps may be added or subtracted, and rearranged in order to achieve the same effect with no loss of teaching generality. Thus, it should be understood that the present invention as depicted in the attached exemplary system block diagrams and procedural flowcharts is for teaching purposes only and may be reworked by one skilled in the art depending on the intended target application.

Predetermined Regions

Throughout the following discussion the term 'predetermined region' will be defined to encompass the area centered at the heart of the active device (MOSFET). Thus, all the process steps mentioned in the context of a MOSFET will create a gate, source/drain, and/or channel doping profiles as well as other structures in an area proximal to the predetermined regions or heart of the active device. The present invention places no restrictions on what occurs outside this context, far from the heart of the active device.

It should be noted that while the predetermined region will generally be spoken of in terms of a MOSFET device, this in no way limits the scope of the present invention. One skilled in the art will recognize that any device capable of regulating the flow of electrical current may be considered to have a predetermined region in proximity to its active current carrying region.

MOSFET not Limitive

The present invention is particularly suitable for use with MOSFET semiconductor devices, but the use of the present teachings is not limited to this particular application. Other semiconductor devices, whether integrated or not, may be applied to the present invention teachings. Thus, while this specification speaks in terms of 'MOSFET' devices, this term should be interpreted broadly to include any device for regulating the flow of electrical current having a conducting channel that has two or more points of electrical contact.

Channel Length not Limitive

The present invention is particularly suitable for use in situations where short channel length MOSFETs are to be fabricated, especially in the range of channel lengths <100 nm. However, nothing in the teachings of the present invention limits application of the teachings of the present invention to these short channel length devices. Advantageous use of the teachings of the present invention may be had with channel lengths of any dimension.

Dopants not Limitive

Throughout the discussion herein there will be examples provided that utilize various dopant technologies in regards to MOSFET device fabrication. These dopants are only illustrative of a specific embodiment of the present invention and should not be interpreted to be limitive of the scope of teachings within the current invention.

Note, however, that the present invention specifically anticipates the use of impurity atoms are selected from the group consisting of Arsenic, Phosphorous, Antimony, Boron, Indium, and/or Gallium as being within the scope of the teachings of the present invention.

Device Type not Limitive

One skilled in the art will readily realize that the present invention is not limited in scope to either N-type or P-type devices but may be used with either or both device types.

Source/Drain not Limitive

Throughout the discussion herein there will be examples provided that make reference to 'source' and 'drain' connections in regards to MOSFET device fabrication. One skilled in the art will recognize that in any given MOSFET configuration the nomenclature surrounding these contacts may be swapped without loss of generality, so that the 'source' may be interchanged with the 'drain' contact with no loss in the scope of the present invention. Additionally, one skilled in the art will recognize that while many preferred embodiments of the present invention may be used to fabricate both source and drain connections, there is no requirement that this be the case in actual practice. One, both, or none of the source/drain connections on a given device in the context of an IC or the like may use the teachings of the present invention to advantage.

Thus, the terms 'source' and 'drain' should be interpreted to include the variants 'drain' and 'source' as well as 'source or drain' and 'source and drain'.

Metals not Limitive

Throughout the discussion herein there will be examples provided that make reference to metals in regards to MOSFET device fabrication. The present invention does not recognize any limitations in regards to what types of metals may be used in affecting the teachings of the present invention. Thus, metals commonly used at the transistor level such as titanium, cobalt and the like are specifically anticipated, as well as a plethora of more exotic metals and other alloys. Nothing in the disclosure limits the use of the invention with any particular metal or alloy. One skilled in the art will recognize that any conductive interconnecting material may be used with no loss of generality in implementing the teachings of the present invention.

Note, however, that the present invention specifically anticipates the use of source/drain electrodes formed from the group consisting of any of Platinum Silicide, Palladium Silicide, Iridium Silicide, and/or the rare-earth suicides as being within the scope of the teachings of the present invention.

Schottky not Limitive

Throughout the discussion herein there will be examples provided that make reference to 'Schottky' barriers and like contacts in regards to IC fabrication. The present invention does not recognize any limitations in regards to what types of Schottky interfaces may be used in affecting the teachings of the present invention. Thus, the present invention specifically anticipates these types of junctions to be created with any form of conductive material.

Additionally, while traditional Schottky junctions are abrupt, the present invention specifically anticipates that in some circumstances an interfacial layer may be utilized between the silicon substrate and the actual Schottky barrier metal. Thus, the present invention specifically anticipates 'Schottky-like' junctions and their equivalents to be useful in implementing the present invention. Furthermore, the interfacial layer may comprise materials that have conductive, semi-conductive, and/or insulator-like properties.

Etching Technology not Limitive

Throughout the discussion herein there will be examples provided that make reference to a variety of etching technologies utilized to remove oxide and/or metal in the IC fabrication process. The present invention does not restrict the type of etching technology used to achieve the results illustrated in the typical process flows. These etching technologies are well known in the art.

Process/Method

One possible process flow for the fabrication of channel implanted, short channel (<100 nm) metal source/drain MOS devices (400) is illustrated in FIGS. 4–9. While this exemplary process flow is just exemplary of the broad teachings of the present invention, it will prove very instructive to one skilled in the art to teach the fundamental concepts of the present invention. This exemplary process flow may be described as follows:

1. Referencing FIG. 4, starting with a silicon substrate (402) that has means for electrically isolating transistors from one another, a thin screen oxide (401) is grown (approximately 200 Å) to act as an implant mask. The appropriate channel dopant species (403) (for example Arsenic and Indium for P-type and N-type devices respectively) is then ion-implanted through the screen oxide to a pre-determined depth in the silicon (approximately 1000 Å or so).

2. Referencing FIG. 5, the screen oxide is then removed in hydro-fluoric acid, and a thin gate oxide (501) (approximately 35 Å) is grown. The gate oxide growth is immediately followed by an in-situ doped silicon film. The film is heavily doped with, for example, Phosphorous for an N-type device and Boron for a P-type device. Using lithographic techniques and a silicon etch that is highly selective to oxide, the gate electrode (502) is patterned as shown in the process step (500) illustrated in FIG. 5.

3. A thin oxide (approximately 100 Å) is then thermally grown on the top surface and sidewalls of the silicon gate electrode. Referencing FIG. 6, an anisotropic etch is then used to remove the oxide layers on the horizontal surfaces (and thus expose the silicon (601)), while preserving them on the vertical surfaces. In this way, a sidewall oxide (602) is formed, and the dopants both in the gate electrode and in the channel region of the device are electrically activated as shown in the process step (600) illustrated in FIG. 6.

4. Referencing FIG. 7, the final step encompasses depositing an appropriate metal (for example, Platinum for the P-type device and Erbium for the N-type device) as a blanket film (approximately 400 Å) on all exposed surfaces. The wafer is then annealed for a specified time at a specified temperature (for example, 400° C. for 45 minutes) so that, at all places where the metal is in direct contact with the silicon, a chemical reaction takes place that converts the metal to a metal silicide (701). The metal that was in direct contact with a non-silicon surface (702) is left unaffected as shown in the process step (700) illustrated in FIG. 7.

5. A wet chemical etch (aqua regia for Platinum, $HNO_3$ for Erbium) is then used to remove the unreacted metal while leaving the metal-silicide untouched. The channel implanted, short channel Schottky barrier MOS device is now complete and ready for electrical contacting to gate, source, and drain as shown in the process step (800) illustrated in FIG. 8.

This process is only one possible way to achieve channel implanted, metal source/drain Schottky MOS devices. One skilled in the art will recognize that many other variants and alternatives exist.

Device/System

Figure 9:
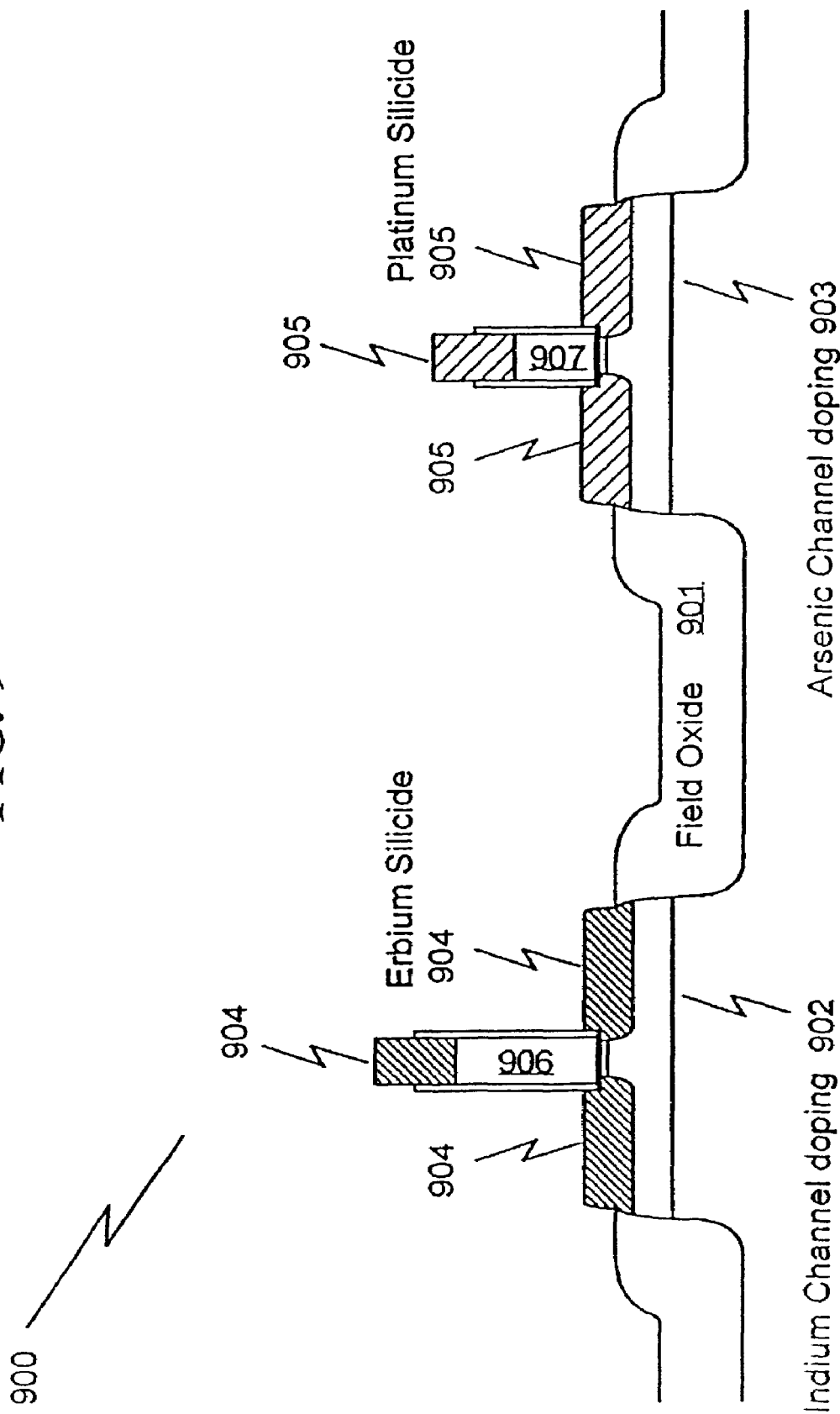
FIG. 9 illustrates an exemplary embodiment of the present invention process fabrication resulting structure. In-situ phosphorous doped silicon, Erbium silicide and Indium channel implants are used for the N-type device for the gate electrode, source/drain electrodes and channel doping respectively. The P-type devices make use of in-situ Boron doped silicon, Platinum Silicide and Arsenic channel implants. The channel dopant concentrations vary significantly in the vertical direction but not in the lateral direction. Gate lengths are typically <100 nm, but may be longer.

FIG. 9 shows a preferred exemplary embodiment of the invention, as exemplified by two final complementary MOSFET structures (900). This embodiment consists of N-channel devices fabricated with Erbium Silicide (904) for the source/drain regions, and a P-channel device fabricated with Platinum Silicide (905).

Vertically varying, laterally non-varying Indium (902) and Arsenic (903) layers are used as the channel dopants for the N-channel and P-channel devices respectively. These dopant atoms are used due to their relatively low rates of diffusion through the silicon lattice (compared to Phosphorous and Boron, the other two possible candidates for channel dopants). This allows for greater thermal budget during fabrication of the device, and therefore less statistical variation in the characteristics of the finished product.

The gate electrodes are fabricated from in-situ Phosphorous and Boron doped polysilicon films for the N-type (906) and P-type (907) devices respectively. In this instance, Phosphorous and Boron are used due to their large solid-solubilities (compared to Arsenic and Indium). The electrodes are doped via the use of an in-situ method, wherein the impurity atoms are deposited at the same time the silicon atoms are. Such a method can achieve very large doping concentrations (approximately $10^{21}$/cm3) and a uniform distribution throughout the thickness of the film. Another option for doping the silicon gate is ion-implantation. This method suffers from several practical problems including charging damage to the thin gate oxide, and the need to redistribute the highly non-uniform as-implanted gate dopants to achieve high doping levels at the gate oxide interface.

The gate electrodes (906) and (907) are less than 100 nm in width (corresponding to the channel length L), as it is in this regime that the advantages of the Schottky barrier architecture over the conventional architecture become apparent. These include simplified processing due to the absence of need for pocket implants, and the resulting reduction in yield loss, capacitance and statistical variations in finished products.

Devices are separated from each other by a thermally grown oxide (called a Field Oxide) (901) that works in conjunction with the channel dopants to electrically isolate the devices from each other.

While the above description contains many specifics, these should not be construed as limitations on the scope of the invention, but rather as an exemplification of one preferred embodiment thereof. One skilled in the art will realize that many other variations are possible. For example, there are many possible candidates for the source/drain metal. It may also be advantageous to insert a thin oxide layer between the metal and the silicon substrate. The silicon substrate itself may be replaced by any number of other semiconductors. Additionally, boundaries between layers or elements can always be graded or interposed with other materials or interface agents to improve performance.

Generalized Process/System Fabrication

Figure 10:
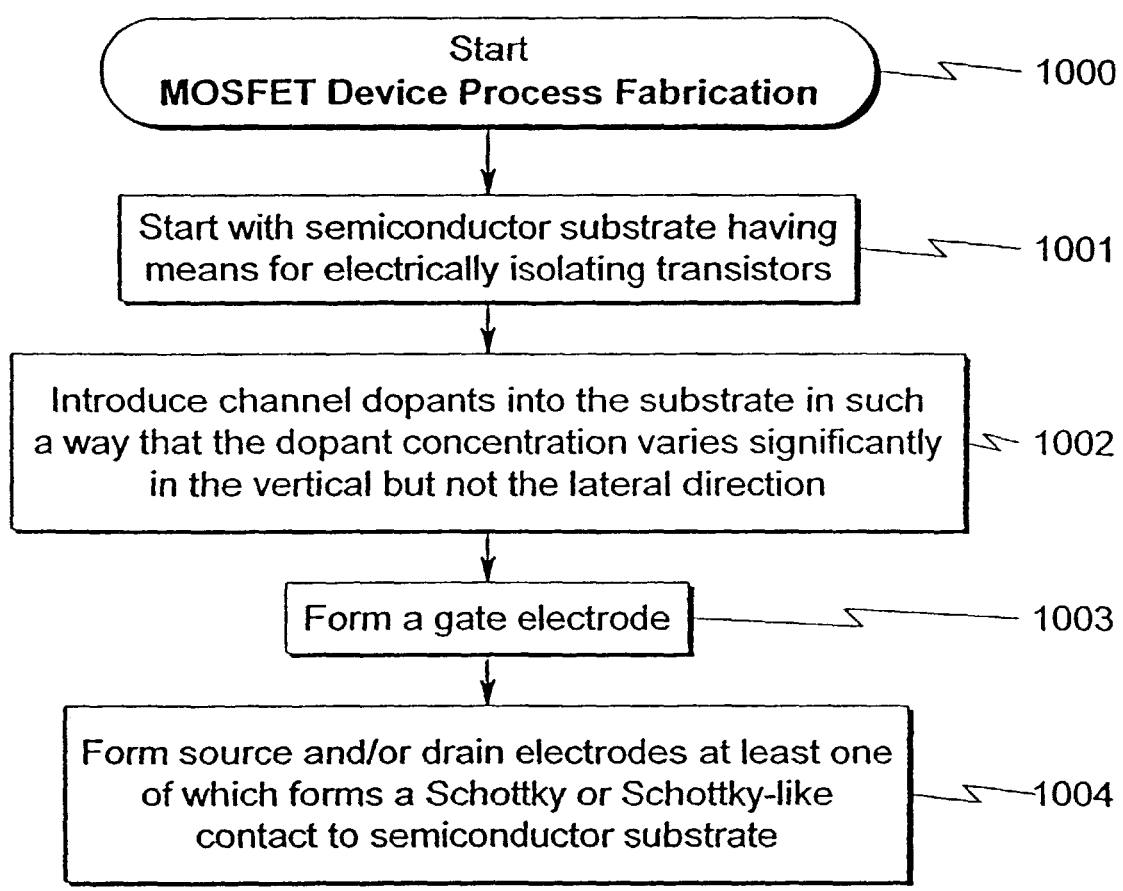
FIG. 10 illustrates an exemplary general system process flowchart showing a method of producing superior MOSFET devices.
Figure 11:
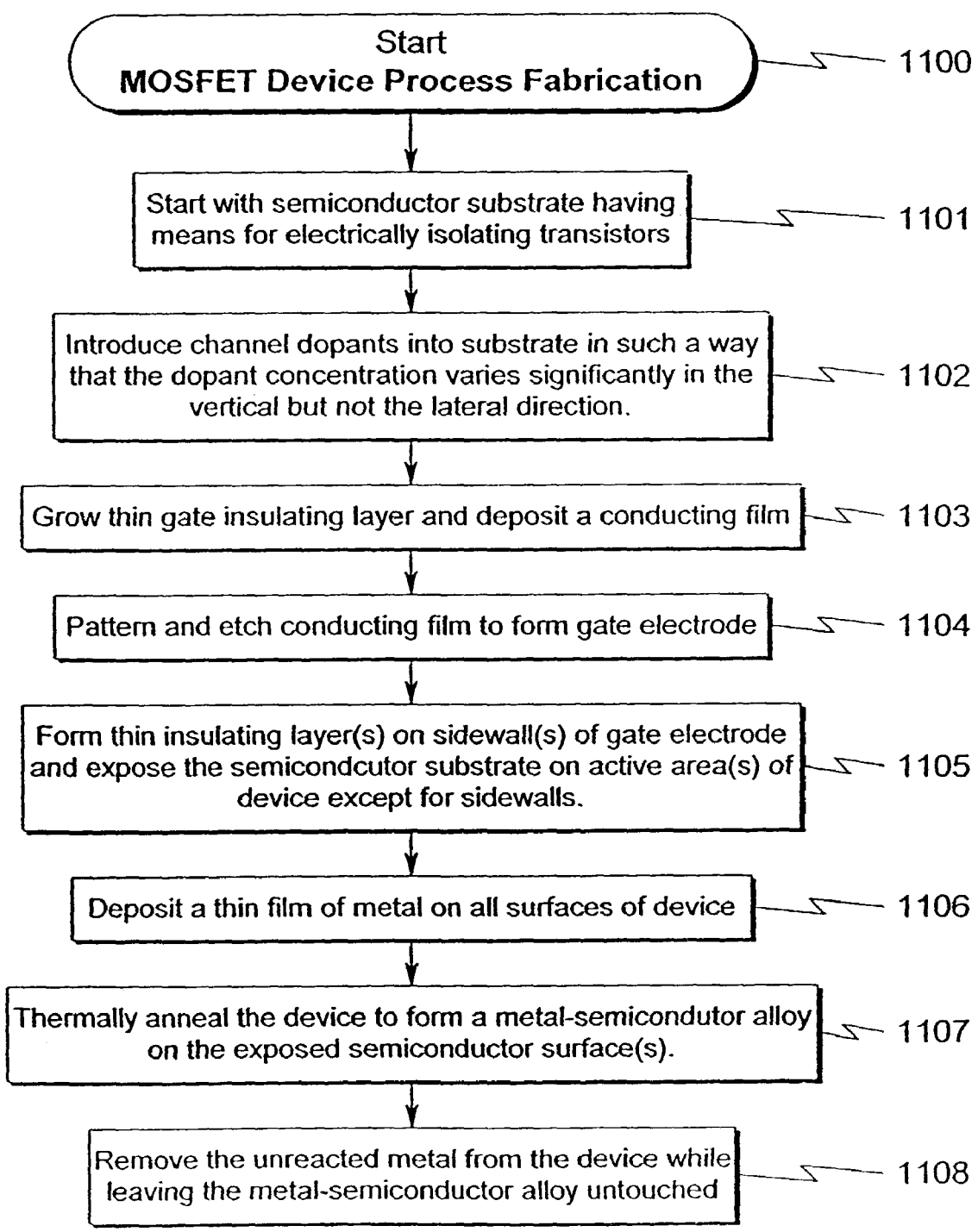
FIG. 11 illustrates an exemplary detailed system process flowchart showing a method of producing superior MOSFET devices.

From the foregoing discussion, the process and system embodied in the present invention may be further generalized as illustrated in the flowcharts shown in FIGS. 10–11.

Generalized Process/System

Referencing FIG. 10, an exemplary generalized MOSFET device process fabrication flow (1000) starts with a semiconductor substrate having means for electrically isolating transistors (1000). On this substrate, channel dopants are introduced in such a way that the dopant concentration varies significantly in the vertical but not the lateral direction (1002). Once this is complete, a gate electrode is formed (1003) on the silicon substrate. Finally, source and/or drain electrodes are formed, at least one of which incorporates a Schottky or Schottky-like contact to the semiconductor substrate (1004).

Detailed Process/System

Referencing FIG. 11, an exemplary detailed MOSFET device process fabrication flow (1100) starts with a semiconductor substrate having means for electrically isolating transistors (1101). On this substrate, channel dopants are introduced in such a way that the dopant concentration varies significantly in the vertical but not the lateral direction (1102). Once this is complete, a gate electrode insulator is formed by growing a thin gate insulating layer and depositing a conducting film (1103) on the silicon substrate.

At this point a series of pattern and etching steps are performed to form a gate electrode (1104). Then one or more thin insulating layers are formed on one or more sidewalls of the gate electrode to selectively expose the semiconductor substrate on the active areas of the device except for the sidewalls (1105). A thin film of metal is deposited on all surfaces of the device (1106), and the device is thermally annealed to form a metal-semiconductor alloy on the exposed semiconductor surfaces (1107). Finally, unreacted metal is removed from the device while leaving the metal-semiconductor alloy untouched to form local interconnect for the formed device (1108).

Summary

In substance, the present invention may be summarized by noting that the basic structure is one in which the substrate between the source and drain is uniformly doped in the lateral direction, non-uniformly doped in the vertical direction, and that the source and/or drain electrodes form Schottky or Schottky-like contacts with the substrate.

CONCLUSION

A short channel length, laterally uniform doped channel, metal source and drain MOS device structure and method for manufacture has been disclosed. The present invention provides for many advantages over the prior art including lower manufacturing costs, superior device characteristics, and tighter control of device parameters. These advantages are achieved primarily through the introduction of a channel doping profile that is both laterally uniform and vertically non-uniform, in conjunction with metal source/drain regions, thus eliminating the need for halo/pocket implants and shallow source/drain extensions. The parasitic bipolar gain is unconditionally eliminated as well.

These features of the invention make it ideal for many applications, including but not limited to high frequency and/or high radiation environments.

I claim:

1. A method of fabricating a short-channel length CMOS device on a semiconductor substrate, the method comprising:
    introducing N-type dopants into a first channel region such that a first dopant concentration profile varies in the vertical direction and is generally constant in the lateral direction;
    introducing P-type dopants into a second channel region of the semiconductor substrate, such that a second dopant concentration profile varies in the vertical direction and is generally constant in the lateral direction;
    forming a first source electrode and a first drain electrode both having a first Schottky barrier contact adjacent the first channel region such that a first channel length is less than about 100 nm; and
    forming a second source electrode and a second drain electrode both having a second Schottky barrier contact adjacent the second channel region, such that the second channel length is less than about 100 nm.

2. The method of claim 1 further comprising providing a first gate electrode over the first channel region, and providing a second gate electrode over the second channel region.

3. The method of claim 2 wherein the first source and drain electrodes are formed by the steps comprising:
    exposing the semiconductor substrate on one or more areas proximal to the first gate electrode;
    depositing a first thin film of metal;
    reacting the first metal with the exposed semiconductor substrate such that a first source electrode and drain electrode are formed having the first Schottky barrier contact adjacent the first channel region; and
    removing the unreacted first metal.

4. The method of claim 2 wherein the second source and drain electrodes are formed by the steps comprising:
    exposing the semiconductor substrate on one or more areas proximal to the second gate electrode;
    depositing a second thin film of metal;
    reacting the second metal with the exposed semiconductor substrate such that a second source electrode and drain electrode are formed having the second Schottky barrier contact adjacent the second channel region; and
    removing the unreacted second metal.

5. The method of claim 2 wherein the first gate electrode is provided by the steps comprising:
    providing a thin insulating layer on the semiconductor substrate;
    depositing a first thin conducting film on the insulating layer;
    patterning and etching the first conducting film to form the first gate electrode; and
    forming one or more thin insulating layers on one or more sidewalls of the first gate electrode.

6. The method of claim 2 wherein the second gate electrode is provided by the steps comprising:
    providing a thin insulating layer on the semiconductor substrate;
    depositing a second thin conducting film on the insulating layer;
    patterning and etching the second conducting film to form the second gate electrode; and
    forming one or more thin insulating layers on one or more sidewalls of the second gate electrode.

7. The method of claim 3 wherein the reacting step is performed by thermal annealing.

8. The method of claim 1 wherein the first source electrode and the drain electrode are formed from a member of the group consisting of: Platinum Silicide, Palladium Silicide and Iridium Silicide; and further wherein the N-type channel dopants are selected from the group consisting of: Arsenic, Phosphorous, and Antimony.

9. The method of claim 1 wherein the second source electrode and the drain electrode are formed from a member of the group consisting of the rare-earth suicides, and further wherein the P-type channel dopants are selected from the group consisting of: Boron, Indium, and Gallium.

10. The method of claim 5 wherein the first thin conducting film of the first gate electrode is formed of Boron doped polysilicon.

11. The method of claim 6 wherein the second thin conducting film of the second gate electrode is formed of Phosphorous doped polysilicon.

12. The method of claim 2 wherein an entire surface of the at least one of the first source electrode and drain electrode forms a Schottky or Schottky-like contact with the semiconductor substrate.

13. The method of claim 2 wherein an entire surface of the at least one of the second source electrode and drain electrode forms a Schottky or Schottky-like contact with the semiconductor substrate.

14. The method of claim 2 wherein the first gate electrode is provided after the completion of all channel doping processes.

15. The method of claim 2 wherein the second gate electrode is provided after the completion of all channel doping processes.

16. A method of fabricating a short-channel length CMOS device on a semiconductor substrate, the method comprising:
    introducing N-type dopants into a first channel region and P-type dopants into a second channel region of the semiconductor substrate, such that the dopant concentration varies in the vertical direction and is generally constant in the lateral direction; and
    forming a first source electrode and a first drain electrode both having a first Schottky baffler contact adjacent the first channel region and a second source electrode and a second drain electrode both having a second Schottky baffler contact adjacent the second channel region, such that both a first channel length and a second channel length are less than about 100 nm.

17. The method of claim 16 further comprising providing a first gate electrode over the first channel region, and providing a second gate electrode over the second channel region.

18. The method of claim 16 wherein the first source electrode and the drain electrode are formed from a member of the group consisting of: Platinum Silicide, Palladium Silicide and Iridium Silicide.

19. The method of claim 18 wherein the N-type channel dopants are selected from the group consisting of: Arsenic, Phosphorous, and Antimony.

20. The method of claim 16 wherein the second source electrode and the drain electrode are formed from a member of the group consisting of the rare-earth silicides; and further wherein the P-type channel dopants are selected from the group consisting of: Boron, Indium, and Gallium.

21. A method of fabricating a short-channel length CMOS device on a semiconductor substrate, the method comprising:
    introducing N-type dopants into a first channel region such that a first dopant concentration profile varies in the vertical direction and is generally constant in the lateral direction;
    introducing P-type dopants into a second channel region of the semiconductor substrate, such that a second dopant concentration profile varies in the vertical direction and is generally constant in the lateral direction;
    providing a first gate electrode over the first channel region;
    providing a second gate electrode over the second channel region;
    forming a first source electrode and a first drain electrode both having a first Schottky barrier contact at least adjacent to the first channel region such that a first channel length is less than about 100 nm; and
    forming a second source electrode and a second drain electrode both having a second Schottky barrier contact at least adjacent to the second channel region, such that the second channel length is less than about 100 nm.

22. The method of claim 21 wherein the first and second source and drain electrodes are provided by the steps comprising:
    exposing the semiconductor substrate on one or more areas proximal to the first gate electrode;
    depositing a first thin film of metal;
    reacting the first metal with the exposed semiconductor substrate such that a first source electrode and drain electrode are formed having the first Schottky baffler contact adjacent the first channel region;
    removing the unreacted first metal;
    exposing the semiconductor substrate on one or more areas proximal to the second gate electrode;
    depositing a second thin film of metal;
    reacting the second metal with the exposed semiconductor substrate such that a second source electrode and drain electrode are formed having the second Schottky baffler contact adjacent the second channel region; and
    removing the unreacted second metal.

23. The method of claim 21 wherein the first and second gate electrodes are provided by the steps comprising:
    providing a thin insulating layer on the semiconductor substrate;
    providing a first thin conducting film on the insulating layer in at least a portion of regions having N-type doping in the semiconductor substrate;
    patterning and etching the first conducting film to form the first gate electrode. providing a second thin conducting film on the insulating layer in at least a portion of regions having P-type doping in the semiconductor substrate; and
    patterning and etching the second conducting film to form the second gate electrode.

24. The method of claim 23 wherein a sidewall is provided on the first and second gate electrodes by the step comprising:
    forming one or more thin insulating layers on one or more sidewalls of the first gate electrode and the second gate electrode.

25. The method of claim 22 wherein the reacting step is performed by thermal annealing.

26. The method of claim 21 wherein the first source electrode and the drain electrode are formed from a member of the group consisting of: Platinum Silicide, Palladium Silicide and Iridium Silicide; and further wherein the N-type channel dopants are selected from the group consisting of: Arsenic, Phosphorous, and Antimony.

27. The method of claim 21 wherein the second source electrode and the drain electrode are formed from a member of the group consisting of the rare-earth silicides, and further wherein the P-type channel dopants are selected from the group consisting of: Boron, Indium, and Gallium.

28. The method of claim 23 wherein the first thin conducting film is formed of Boron doped polysilicon and the second conducting film is formed of Phosphorous doped polysilicon.

29. The method of claim 21 wherein an entire surface of the at least one of the first source electrode and drain electrode forms a first Schottky or Schottky-like contact with the semiconductor substrate.

30. The method of claim 21 wherein an entire surface of the at least one of the second source electrode and drain electrode forms a second Schottky or Schottky-like contact with the semiconductor substrate.

31. The method of claim 21 wherein the first Schottky or Schottky-like contact of the at least one of the first source electrode and drain electrodes is formed at least in areas adjacent to the first channel.

32. The method of claim 21 wherein the second Schottky or Schottky-like contact of the at least one of the second source electrode and drain electrodes is formed at least in areas adjacent to the second channel.

33. The method of claim 21 wherein the first gate electrode is provided after the completion of all channel doping processes.

34. The method of claim 21 wherein the second gate electrode is provided after the completion of all channel doping processes.

35. The method of claim 21 wherein the first gate electrode has a length not exceeding 100 nm.

36. The method of claim 21 wherein the second gate electrode has a length not exceeding 100 nm.

37. The method of claim 21 wherein the first and second source and drain electrodes are provided by the steps comprising:
    exposing the semiconductor substrate on one or more areas proximal to the first gate electrode and one or more areas proximal to the second gate electrode;
    providing an interfacial layer at least in the exposed semiconductor substrate regions;
    exposing the semiconductor substrate at least on one ore more areas proximal to the first gate electrode;
    depositing a first thin film of metal;
    reacting the first metal with the exposed semiconductor substrate such that a first metal source electrode and drain electrode are formed having a first Schottky-like contact adjacent the first channel region, the first Schottky-like contact having an interfacial layer between the first metal source and/or drain and the channel region;
    removing the unreacted first metal;
    exposing the semiconductor substrate at least on one or more areas proximal to the second gate electrode;
    depositing a second thin film of metal;
    reacting the second metal with the exposed semiconductor substrate such that a second metal source electrode and drain electrode are formed having a second Schottky-like contact adjacent the second channel region, the second Schottky-like contact having an interfacial layer between the second metal source and/or drain and the channel region; and
    removing the unreacted second metal.

38. The method of claim 37 wherein the interfacial layer is an insulator.

* * * * *

UNITED STATES PATENT AND TRADEMARK OFFICE
CERTIFICATE OF CORRECTION

PATENT NO.       : 7,052,945 B2                                          Page 1 of 1
APPLICATION NO.  : 10/360194
DATED            : May 30, 2006
INVENTOR(S)      : John P. Snyder It is certified that error appears in the above-identified patent and that said Letters Patent is hereby corrected as shown below:

| Col | Line | PTO | Should Read |
|-----|------|-----|-------------|
| 8 | 55 | " suicides " | -- silicides -- |

Signed and Sealed this

Twenty-sixth Day of December, 2006

JON W. DUDAS
*Director of the United States Patent and Trademark Office*